United States Patent [19]

Teer

[11] Patent Number: 5,556,519
[45] Date of Patent: Sep. 17, 1996

[54] MAGNETRON SPUTTER ION PLATING

[76] Inventor: Dennis G. Teer, Tibbetts Close, Worcester Road, Sharwley, WR6 6TD, England

[21] Appl. No.: 210,246

[22] Filed: Mar. 17, 1994

Related U.S. Application Data

[63] Continuation of Ser. No. 927,523, filed as PCT/GB91/00417, Mar. 18, 1991 published as WO91/14797, Oct. 3, 1991.

[30] Foreign Application Priority Data

Mar. 17, 1990 [GB] United Kingdom ............... 9006073

[51] Int. Cl.$^6$ ................................................. C23C 14/35
[52] U.S. Cl. ........................... 204/192.12; 204/298.19; 204/298.18; 204/298.05; 204/298.06; 204/298.26; 427/523; 427/524; 427/528
[58] Field of Search ..................... 204/192.12, 298.06, 204/298.05, 298.18, 298.19, 298.26; 427/523, 524, 528

[56] References Cited

U.S. PATENT DOCUMENTS

| | | | |
|---|---|---|---|
| 4,692,230 | 9/1987 | Nihei et al. | 204/298.05 X |
| 4,756,810 | 7/1988 | Lamont, Jr. et al. | 204/298.06 X |
| 4,767,516 | 8/1988 | Nakatsuka et al. | 204/298.26 X |
| 4,871,434 | 10/1989 | Munz et al. | 204/298.06 X |
| 4,880,515 | 11/1989 | Yoshikawa et al. | 204/298 X |
| 5,013,419 | 5/1991 | Rickerby et al. | 204/298.05 |
| 5,196,105 | 3/1993 | Feuerstein et al. | 204/298.26 X |

FOREIGN PATENT DOCUMENTS

| | | | |
|---|---|---|---|
| 61-179864 | 1/1987 | Japan . | |
| 0077460 | 4/1987 | Japan | 204/298.18 |
| 61176073 | 10/1989 | Japan . | |
| 1-298154 | 12/1989 | Japan | 204/298.18 |

Primary Examiner—R. Bruce Breneman
Attorney, Agent, or Firm—Malloy & Malloy, P.A.

[57] ABSTRACT

A magnetron sputter ion plating system has two or more magnetron assemblies spaced around a substrate centrally located relative to the magnetrons. The magnetrons are arranged so that adjacent magnetrons have outer magnetic assemblies of opposite polarity, so that magnetic field lines link adjacent magnetrons, so as to produce a substantially closed ring of magnetic flux. This substantially traps all electrons generated in the system, and increase the level of ionization surrounding the substrates increasing the ion bombardment of the substrates. Several embodiments are disclosed.

10 Claims, 4 Drawing Sheets

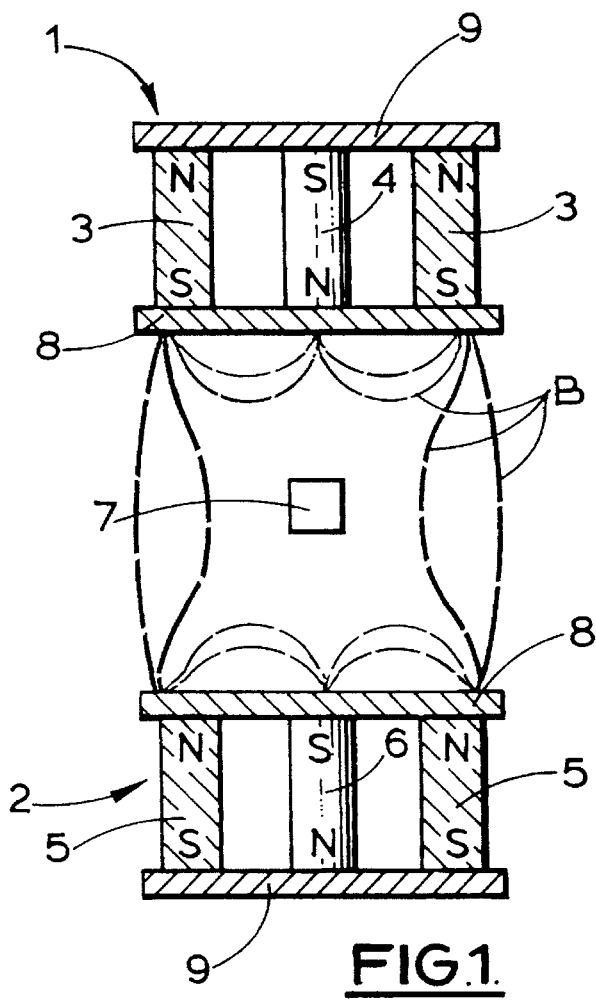
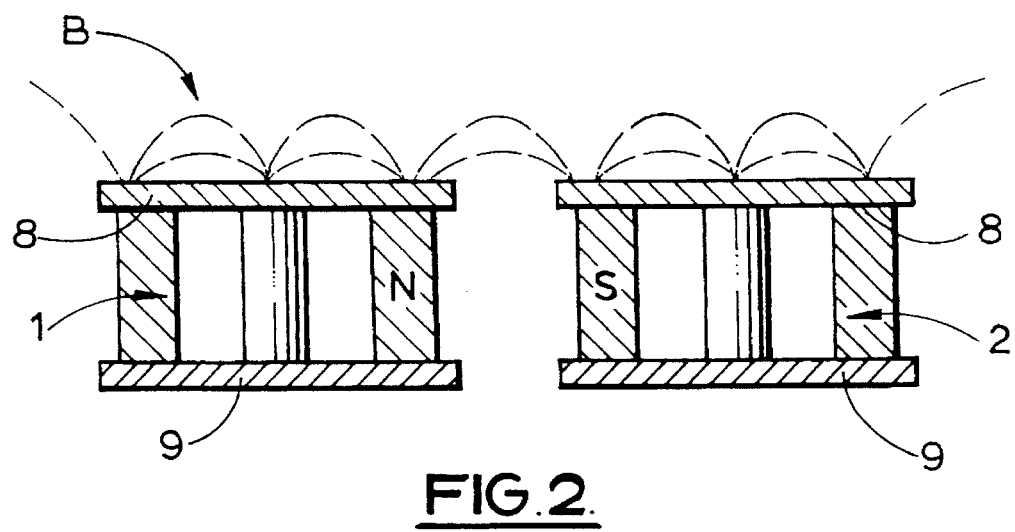

MAGNETRON SPUTTER ION PLATING

This is a continuation of application Ser. No. 07/927,523, filed as PCT/GB91/00417, Mar. 18, 1991 published as WO91/14797, Oct. 3, 1991.

This invention relates to equipment for the Physical Vapour Deposition technique of magnetron sputter ion plating, that is to say for depositing materials in atomic and/or ionic form onto a receiving substrate by electrical discharge, for example to form coatings.

Sputtering is a well known process in which a cathode of a glow discharge is made the target of ions produced in the glow discharge in a surrounding low-pressure gas. The ions are accelerated towards the target by an electric field and the impact of them on the target displaces particles of the surface of the target; these particles are deposited on the surface of a suitably placed substrate to form the coating.

It is known that the intensity of the glow discharge can be increased significantly by the so-called magnetron effect, which caused the ionization electrons to be trapped in a region where the electric field is crossed by an added magnetic field. This is the basis of magnetron sputtering, which gives deposition rates approximately ten times those from non-magnetron electrodes and also allows sputtering to take place at much lower gas pressures. Magnets are placed to produce lines of force passing across and above the surface of the target.

Ion plating is a well known process in which a metal vapour produced in a vacuum system is deposited onto a substrate whilst simultaneously the substrate is bombarded with ions. The ion bombardment improves both the adhesion and the structure of the coating.

The metal vapour for ion plating can be produced by several techniques including sputtering. If sputtering is used as the vapour source in ion plating the technique is called sputter ion plating. If magnetron sputtering is used as the vapour source in ion plating the technique is called magnetron sputter ion plating.

In ion plating the ions which bombard the sample during deposition can be produced by several methods. In the basic ion plating method the ions are produced in an abnormal glow discharge with the samples acting as cathode. This is an inefficient process and typically less than 1 atom in 1000 is ionised in an abnormal glow discharge. The ion current to the samples is low, and is not sufficient to produce the dense coatings required in many applications, even though the samples are held at a high negative potential.

The ionization can be increased in several ways. For example, the supply of ionising electrons can be increased by means of a hot filament and an electrode which is positive with respect to the filament, or a hollow cathode can also be used to provide a copious supply of electrons.

Rather than use additional filaments and electrodes to provide ionization enhancement, it is convenient to use a vapour source that itself can act as a source of ionization.

A hot filament electron beam gun evaporator, a resistance heated crucible, and a simple diode sputter electrode are commonly used deposition sources that create little extra ionization. On the other hand, hollow cathode electron beam guns, glow discharge beam guns and arc sources all produce intense ionization at a level of over 50% ionization without the need for additional ionization enhancement devices, and consequently can be used to produce very dense coatings in ion plating systems.

Magnetron sputtering electrodes have been used in ion plating systems and they do increase the ionization, but in the past this has not been sufficient to affect the coating structure and to produce dense coatings.

A recent development has been the unbalanced magnetron which has inner and outer magnets and in which the field strength of the outer magnets is much higher than the field strength of the inner magnets. The 'extra' field lines leaving the outer magnets trap electrons escaping from the magnetron discharge and prevent them from drifting to the various earthed parts of the chamber. These electrons cause ionization in the vicinity of the electrically biased substrate and the ions so formed are attracted to the substrate by the substrate bias, and the substrates receive a higher ion current than in a situation where the magnetrons are balanced. However, the intensity of ionization may still be less than is desirable for the deposition of dense coatings, unless the outer magnets are made exceptionally strong.

It is thus clear that there are many ways of creating ions for sputtering or ion plating.

The aim of the invention is to provide an improved magnetron sputter ion plating system, with an increased intensity of useful ionization.

According to the invention we provide a magnetron sputter ion plating system comprising electric field means for producing an electric field directed towards an electrically biased, cathode, substrate to be coated so as to attract ions to the substrate, and magnetic field means, the magnetic field means comprising at least two magnetrons each having an inner pole and an outer ring pole of opposite polarity, the magnetrons being so arranged that the outer ring pole of one magnetron and the outer ring pole of the other, or another, magnetron are of opposite polarities and are near enough to each other so that magnetic field lines extend between the outer ring poles of the magnetrons linking them so as to prevent the escape of electrons from the system between them so that these electrons are not lost to the system and are available to increase the ionization at the electrically biased substrate.

It will be appreciated that magnetrons having an inner pole and an outer ring pole are well known. The inner pole can be a single magnet, or a line or group of magnets. The outer "ring" pole can be formed from a single magnet or several separate magnets side by side. The "ring" need not be cylindrical or circular, but could be of square or rectangular shape, or indeed any suitable figure.

The linking of the two magnetrons by magnetic flux traps electrons in the system and increases the amount of ionization which occurs. We can thus provide practical magnetron sputter ion plating systems that give significantly increased ionization using either balanced magnetrons or unbalanced magnetrons with outer magnets of moderate field strength.

Preferably the outer, ring, poles are angularly spaced relative to the position of the substrate to be coated so that they subtend a substantial angle at that substrate.

The system may comprise a plurality of magnetrons the adjacent outer poles, or end regions, of which are of opposite polarities. The magnetrons are preferably arranged around the substrate and the substrate may have a generally central position between the magnetrons. Preferably the magnetrons are equally-angularly spaced in a polygon or ring around the substrate.

The electric field may be provided extending substantially radially between the substrate and the magnetrons the substrate being at a negative electrical potential. The negative potential of the substrate may vary from zero up to substantially higher values, say −1000V.

The magnetron poles may comprise a target of source material from which ions are produced.

Preferably there are an even number of magnetrons.

The system may further comprise a pumping port to control the pressure of an ionising gas, such as argon, in the system.

According to a second aspect the invention comprises a method of magnetron sputter ion plating a substrate to be coated comprising providing a first magnetron having an inner ring pole and an outer ring pole of opposite polarity, and a second magnetron having an inner and outer ring pole of opposite polarity, with the outer ring pole of the first magnetron being of opposite polarity to that of the second magnetron; electrically biasing a substrate to be coated so as to make it a cathode to attract positive ions; and reducing the leakage of electrons from between the magnetron by arranging for magnetic flux to extend between their outer ring poles, thereby trapping electrons which could otherwise escape between the magnetrons and increasing the coating ion density at the substrate to be coated.

In this way the ion density at the electrically biased substrate is significantly increased.

BRIEF DESCRIPTION OF THE DRAWINGS

Embodiments of the invention will now be described by way of example only with reference to the accompany drawings of which:

FIG. 1 schematically illustrates a magnetron sputter ion plating system comprising two magnetrons and illustrating an arrangement of magnetic polarities in accordance with the invention;

FIG. 2 schematically illustrates another system and shows the arrangement of magnetic polarities when two magnetrons are placed side by side;

FIGS. 1 and 2 schematically show the basic concept behind the present invention. Two magnetrons 1 and 2 of FIG. 1 each have an outer ring magnet 3 and 5 respectively and a central core magnet 4 and 6 respectively. In FIG. 1, which may be a practical arrangement, the outer magnet 3 of magnetron 1 is of "south" polarity and the inner core magnet 4 is of "north" polarity (in their regions adjacent a substrate 7). The outer magnet 5 of magnetron 2 is of north polarity and its core 6 of south polarity (In their 5 regions adjacent the substrate 7). Thus the magnetic field lines of magnetrons 1 and 2 form a continuous barrier, trapping electrons which diffuse from the magnetron plasmas.

FIG. 1 also shows an electrically biased substrate 7 to be coated, target shrouds 8 of source material covering the exposed faces of the magnetron poles, and the magnetic field B. The magnetron poles have a soft iron backing plate 9 to complete their internal magnetic circuits.

As will be seen from FIG. 1, the magnetic field B fully surrounds the substrate 7 and serves to form a ring within which electrons are trapped. Since the electrons cannot escape the system they are available to enhance the ionization associated with the electrically biased substrate, creating a higher ion density than was previously possible.

FIG. 2 illustrates two magnetron pole assemblies disposed side by side, the magnetic flux B still bridging the gap between the assemblies and preventing the escape of electrons through the gap between them.

Figure 3:
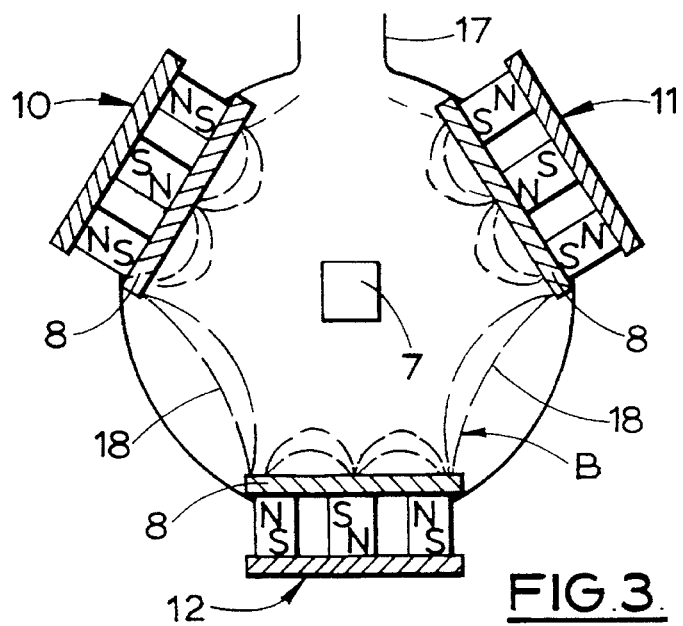
FIG. 3 illustrates schematically a practical version of a magnetron sputter ion plating system.

Turning to FIG. 3, this illustrates a practical form of the invention. Three magnetron pole assemblies 10, 11, 12 are provided approximately equi-angularly spaced with the substrate 7 at the center of the triangle. Adjacent outer magnetic assemblies of the magnetrons 10 and 12 and 11 and 12 respectively are of opposite polarity. A pumping port 17 is provided between the two adjacent poles of similar polarity of assemblies 10 and 11.

Magnetic field lines 18 extend from the adjacent ends of the magnetrons 10 and 12, and the magnetrons 11 and 12 and prevent the escape of electrons through the gaps between the magnetrons 10 and 12 and 11 and 12. Thus electrons cannot escape to ground parts of the system, except in the region of the pumping port.

In use an inert gas such as argon is provided in the chamber of the system and electrons are accelerated in the chamber by a potential difference applied to the magnetron targets 8 to ionize the gas, producing more electrons and argon ions. The argon ions present in the chamber bombard the targets 8 of source material and produce a coating flux of source material. The argon ions also bombard the substrate. The magnetic field lines B serve to form a continuous barrier to the electrons diffusing from the magnetron discharges and ensure that these electrons are not lost to the system without performing their useful function of enhancing the glow discharge associated with the negatively electrically biased substrates, increasing the ion current to the substrate.

Figure 4:
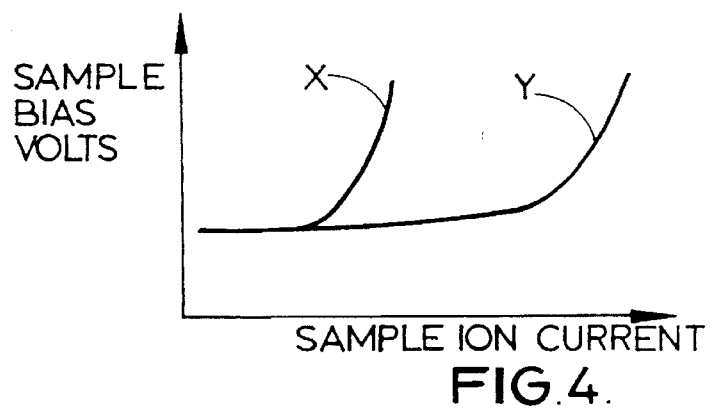
FIG. 4 shows the improvement in ion current of the embodiment of FIG. 3 in comparison with a known system.

FIG. 4 illustrates the improvement which the present invention can achieve. Line X shows the ion current available for different bias voltages in an arrangement similar to that of FIG. 3, but with each magnetron pole assembly being identical (for example, all three magnetrons having outer magnet assemblies with south poles akin to magnetrons 10 and 11) so that there is no flux between adjacent magnetrons. Line Y shows the ion current produced by the embodiment of FIG. 3 which is far higher because of the flux between adjacent assemblies trapping ionising electrons.

Figure 5:
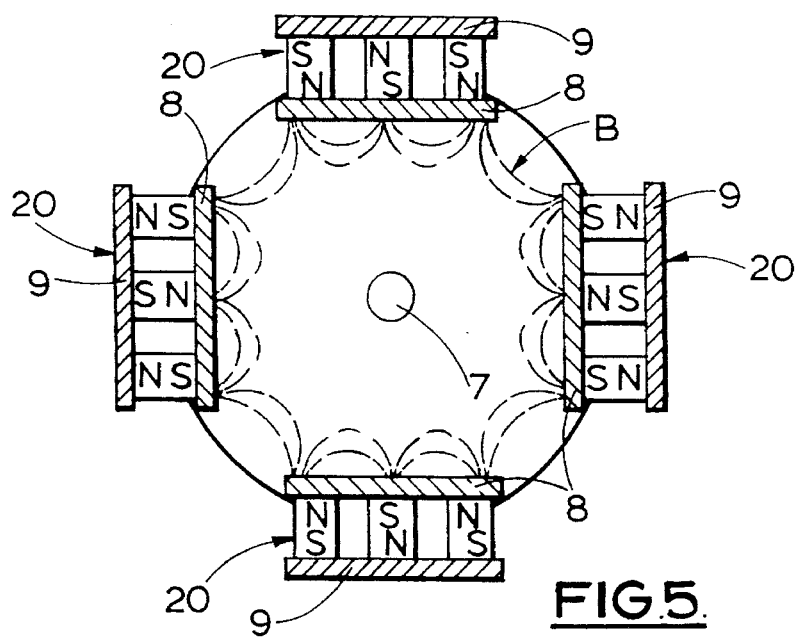
FIG. 5 illustrates another practical embodiment of the invention.

FIG. 5 shows another practical embodiment of a magnetron sputter ion plating system. Four magnetrons 20 are provided equi-angularly spaced in a ring with the substrate 7 at is center. Each magnetron is similar to those described in FIG. 1 and similar components have been given similar reference numerals. A pumping port (not shown) is provided out of the plane of the four magnetrons, for example the system may have the overall cylindrical shape of a dustbin and the pumping port may be provided at the base of the dustbin, with the magnetrons, and substrate, above the base.

The magnetic field B forms a continuous ring surrounding the substrate and traps electrons in the ring. Since an even number of magnetron pole assemblies is provided the flux ring can be complete. There is an advantage in providing an even number of magnetrons. Six or eight magnetron pole assemblies are also considered good configurations, but clearly more could be provided if desired. Adjacent magnetrons would have outer magnet assemblies of opposite polarity.

Figure 6:
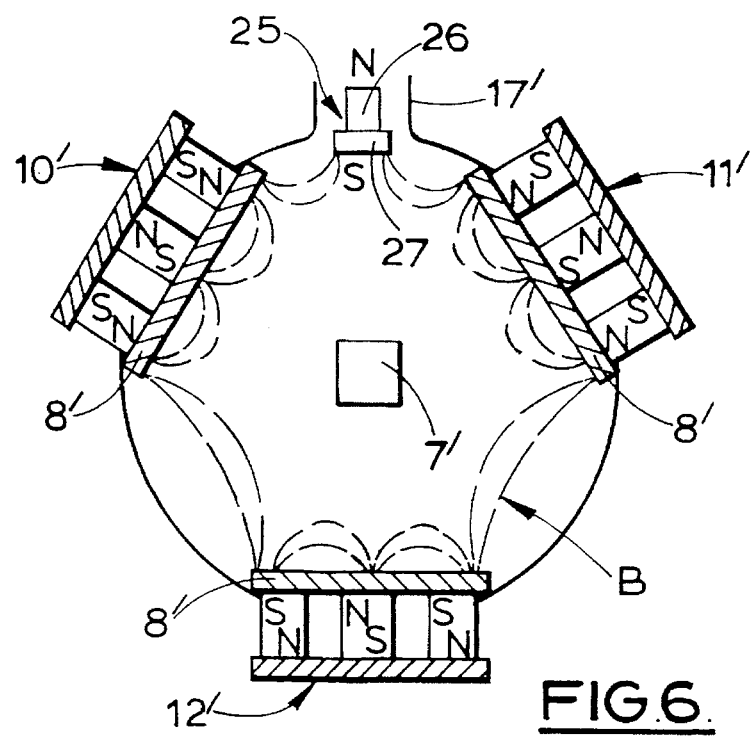
FIG. 6 shows a magnetron sputter ion plating system similar to that of FIG. 3, but modified.

FIG. 6 illustrates a system similar to that of FIG. 3, but modified to alleviate the loss of ionising electrons at the region between the two pole assemblies near to the pumping port. Similar components have been given similar reference numerals. An electrode component 25 is provided between the adjacent poles of the same polarity of magnetrons 10' and 11', with the component 25 providing an additional magnetic pole of opposite polarity between the two similar adjacent poles. The component 25 comprises a magnet 26 and a cap 27 of ferromagnetic material. The electrode component 25 is at a floating potential (it is insulated from earth). The magnetic field lines from magnetrons 10' and 11' are attracted to the magnetic electrode 25, so providing a closed trap for electrons.

The type of additional magnetic electrode shown in FIG. 6 can be placed between neighbouring magnetron electrodes of similar polarity in a coating system to provide a barrier to the electrons escaping from the magnetron discharges, and so increase the intensity of ionization and the ion current to the electrically biased substrates.

Figure 7:
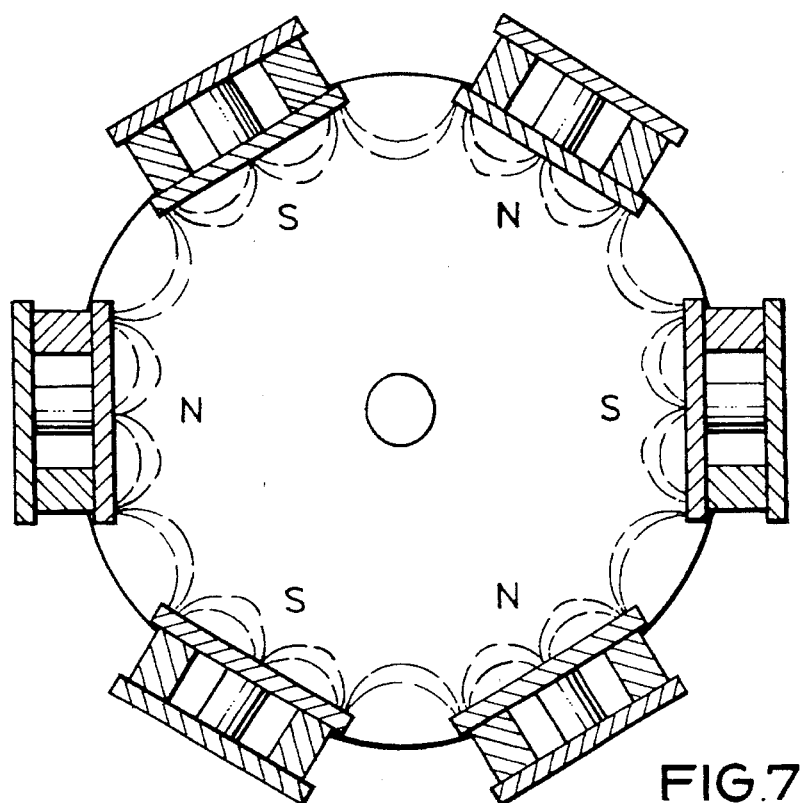
FIG. 7 shows a still further embodiment of the invention.

FIG. 7 illustrates another embodiment of the invention which has six magnetron pole assemblies, with next-neighbour outer pole assemblies having opposite polarity.

Figure 8:
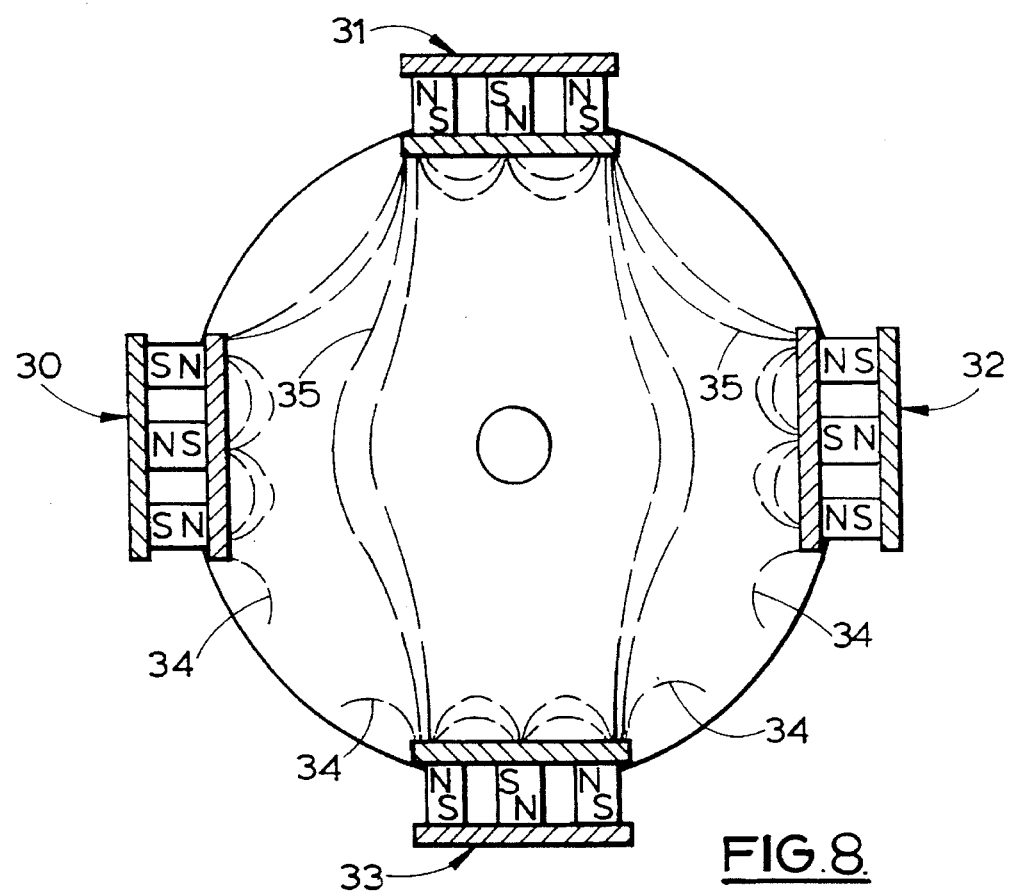
FIG. 8 shows another embodiment of the invention which is similar in some ways to that of FIG. 1.

FIG. 8 shows a magnetron sputter ion plating system having four magnetron pole assemblies 30, 31, 32 and 33. Pole assemblies 30 and 32 have alternate polarities, but pole assembly 33 presents poles of the same polarity to the adjacent portions of pole assemblies 30 and 32. Some magnetic field lines, lines 34, are not closed and escape the system. However, pole assemblies 31 and 33 also have magnetic field lines 35 connecting their regions of opposite polarity. A reasonable degree of magnetic closure still exists and we still achieve increased ionization.

Even numbers of pole assemblies with next-neighbour assemblies being of opposite polarity are preferred (for example the embodiments of FIGS. 5 and 7), but other arrangements can work well.

Figure 9:
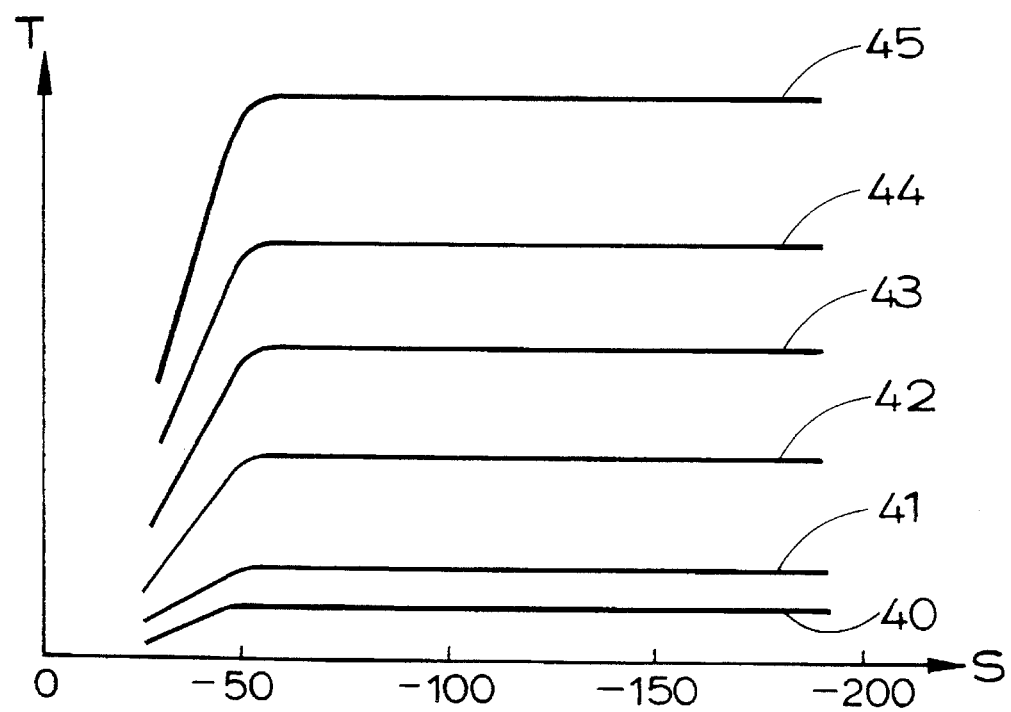
FIG. 9 is a graph comparing the ion current to a substrate against the bias voltage applied to the substrate for a number of different magnetron sputtering ion plating systems.

FIG. 9 compares the performance of different magnetron sputter ion plating systems. Axis S represents the bias voltage applied to the substrate (in volts), and axis T represents the ion current to the substrate target. Lines 40 to 45 exemplify the performance of magnetron system having the following characteristics:

Line 40 - Three pole assemblies (balanced), all of the same polarity and using ferrite magnets.
Line 41 - Three pole assemblies (unbalanced), all of the same polarity and using ferrite magnets.
Line 42 - Three mixed or alternating polarity magnetron pole assemblies (unbalanced), with ferrite magnets (as in the embodiment of FIG. 3).
Line 43 - Three mixed or alternating polarity magnetron pole assemblies (unbalanced), with ferrite magnets, plus a dummy, or additional, pole assembly (as in the embodiment of FIG. 6).
Line 44 - Four mixed or alternating polarity magnetron pole assemblies (unbalanced) with ferrite magnets.
Line 45 - Four mixed or alternating polarity magnetron pole assemblies (unbalanced) with Nd Fe B magnets.

The ionization enhancement effect of the "mixed" polarity magnetrons is effective even when relatively weak magnets such as ferrites are used. The ionization enhancement effect is even greater when stronger magnetic materials, such as Neodymium Iron Boron are used.

Arrangements of three and four magnetrons as shown in FIG. 3 and 5 have been used for the deposition of titanium nitride and other hard coats. The high ionization produced by the 'mixed' magnetron effect is important in depositing coatings with high adhesion and hard dense structures.

The ion bombardment of the substrates is due to the ions formed in the glow discharge around the substrates being attracted to the substrates by the negative electrical bias voltage applied to the substrates. This bias voltage can be a DC voltage, or Radio Frequency power can be applied to the substrates in order to produce an induced negative voltage. The radio frequency technique is necessary when the substrates are of an electrically insulating material and/or when the coating material is electrically insulating, but can also be used when the substrates and the coating material are electrically conducting. The improvements in coating adhesion and structure brought about by the increased ionization due to the mixed magnetron polarity arrangement occur for both the DC and RF substrate bias.

I claim:

1. A magnetron sputter ion plating apparatus comprising:

electric field means;

holding means for supporting a substrate to be coated;

magnetic field means;

said magnetic field means comprising at least two magnetrons each having an inner pole and an outer pole, said outer pole being of polarity opposite to that of said inner pole, wherein in use a substrate to be coated is provided at said holding means and is electrically biased by said electric field means to be a cathode so as to attract ions to said substrate;

said electric field means generating an electric field directed towards said substrate to be coated;

and wherein at least one of said magnetrons is an unbalanced magnetron, and said outer pole of one said magnetron and said outer pole of another adjacent magnetron are of opposite polarity and are near enough to each other so that a substantial magnetic field extends between said outer poles, so as to prevent substantial escape of ionizing electrons between the adjacent magnetrons so that these said electrons are not lost and are available to increase the ionization at said electrically biased substrate;

and wherein said magnetic field means generates a plasma holding field, said plasma holding field being generated by direct magnetic linkage between said outer poles of said adjacent magnetrons, and wherein said substrate is inside said plasma holding field.

2. A magnetron sputter ion plating apparatus as recited in claim 1 wherein said magnetic field means comprises at least three magnetrons and there are more of said magnetrons of one polarity than of an opposite polarity.

3. A magnetron sputter ion plating apparatus as recited in claim 1 wherein said magnetic field means comprises four magnetrons and the outer poles of three of said magnetrons are of one polarity and the outer pole of a fourth of said magnetrons is of an opposite polarity.

4. A magnetron sputter ion plating apparatus comprising:

an earthed coating chamber comprising an anode of the apparatus;

holding means for supporting a substrate to be coated;

magnetic field means;

electric field means;

said magnetic field means comprising at least a first and a second magnetron each having an inner pole and an outer pole and being at a high negative electrical potential relative to said earthed chamber, said outer pole being of polarity opposite to that of said inner pole, and there being a space defined between adjacent portions of said first and second magnetrons; and wherein in use a substrate to be coated is provided at said holding means and is electrically biased by said electric field means to be a cathode so as to attract ions to said substrate;

and wherein said outer pole of said first magnetron and said outer pole of said second magnetron are of opposite polarity and are near enough to each other so that a substantial magnetic field generated by said magnetrons extends through said space provided between said magnetrons between said outer poles, from one said pole to the other said pole, so as to prevent substantial escape of ionizing electrons between said first and second magnetrons so that these said electrons are not lost and are available to increase substantially the ionization at said electrically biased substrate; and wherein said magnetic field extending through said space between said outer poles of said magnetrons link together all of said magnetrons provided in said apparatus thereby creating a substantially closed ring of magnetic field, said substrate being disposed inside said closed ring;

and wherein at least one of said first and second magnetrons is an unbalanced magnetron.

5. A magnetron sputter ion plating apparatus according to claim 4 wherein both said first and second magnetrons are unbalanced magnetrons.

6. A magnetron sputter ion plating apparatus as recited in claim 4 wherein said magnetic field means comprises at least three magnetrons and there are more of said magnetrons of one polarity than of an opposite polarity.

7. A magnetron sputter ion plating apparatus as recited in claim 4 wherein said magnetic field means comprises four magnetrons and said outer poles of three of said magnetrons are of one polarity and said outer pole of a fourth of said magnetrons is of an opposite polarity.

8. A magnetron sputter ion plating apparatus comprising:

a coating chamber comprising an anode of the apparatus;

holding means for supporting a substrate to be coated;

magnetic field means;

electric field means;

said magnetic field means comprising at least two adjacent magnetrons each having an inner pole and an outer pole, said outer pole of each said magnetron being of polarity opposite to that of its inner pole, wherein in use a substrate to be coated is provided at said holding means and said electric field means generating an electric field directed towards said substrate to be coated so as to cause positive ions to be attracted to said substrate;

and wherein said outer pole of a first one of said magnetrons and said outer pole of an adjacent one of said magnetrons are of opposite polarity and are near enough to each other so that magnetic field lines leave one said pole and extend directly between said outer poles and terminate on said other outer pole so as to prevent substantial escape of ionizing electrons between said first and said adjacent magnetrons so that these said electrons are not lost and are available to increase the ionization at said substrate;

and wherein said magnetic field means is comprised solely of one or more magnetrons, without there being any other significant magnetic field generating means that is not a magnetron that is linked by magnetic field lines to another of said magnetrons;

and wherein at least one of said first and adjacent magnetrons is an unbalanced magnetron.

9. A method of magnetron sputter ion plating a substrate to be coated comprising the steps of:

providing a first magnetron having an inner ring pole and an outer ring pole of opposite polarity, and a second magnetron having an inner and outer ring pole of opposite polarity to those of said first magnetron;

ensuring that said outer ring pole of said first magnetron is of polarity opposite to that of said second magnetron;

arranging said first magnetron to be adjacent to said second magnetron;

electrically biasing a substrate to be coated so as to make it a cathode to attract positive ions;

generating an electric field directed towards said substrate to be coated;

substantially reducing the leakage of electrons from between said magnetrons by directly linking by magnetic flux said outer ring pole of said first magnetron to the adjacent outer ring pole of said second magnetron, thereby trapping a substantial number of electrons which would otherwise escape between the magnetrons and thereby substantially increasing the coating ion density at the substrate to be coated; and using an unbalanced magnetron as at least one of said first and second magnetrons whereby the strength of the magnetic field extending between said first and second magnetrons is increased.

10. A method according to claim 9 wherein two unbalanced magnetrons are used.

* * * * *